(12) United States Patent
Jackson et al.

(10) Patent No.: US 8,754,593 B2
(45) Date of Patent: Jun. 17, 2014

(54) LIGHT EMITTING DIODE ASSEMBLY HAVING ACTIVE COOLING

(75) Inventors: Stephen M. Jackson, Mount Joy, PA (US); Matthew Edward Mostoller, Hummelstown, PA (US); Mohammad S. Ahmed, Harrisburg, PA (US); Gerald J. Wingle, Jr., Reinholds, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 319 days.

(21) Appl. No.: 13/098,584

(22) Filed: May 2, 2011

(65) Prior Publication Data

US 2012/0280620 A1 Nov. 8, 2012

(51) Int. Cl.
*H05B 37/02* (2006.01)
(52) U.S. Cl.
USPC ............ 315/309; 315/113; 315/118; 362/106
(58) Field of Classification Search
USPC ......... 315/307, 112–113, 117, 118, 291, 309; 362/103, 106
See application file for complete search history.

(56) References Cited

U.S. PATENT DOCUMENTS

| | | | |
|---|---|---|---|
| 6,621,239 B1 * | 9/2003 | Belliveau | 315/312 |
| 2005/0279949 A1 * | 12/2005 | Oldham et al. | 250/458.1 |
| 2010/0027276 A1 * | 2/2010 | Kornitz et al. | 362/373 |
| 2010/0134017 A1 * | 6/2010 | Yatsuda et al. | 315/113 |
| 2010/0134024 A1 | 6/2010 | Brandes | |

FOREIGN PATENT DOCUMENTS

| | | |
|---|---|---|
| EP | 2 157 371 A2 | 2/2010 |
| WO | 2010 136140 A1 | 12/2010 |

OTHER PUBLICATIONS

Annex to International Search Report, International Application No. PCT/US2012/035325, International Filing Date, Apr. 27, 2012.

\* cited by examiner

*Primary Examiner* — James H Cho

(57) ABSTRACT

A light emitting diode (LED) assembly is provided having a LED and a temperature sensor for monitoring a temperature of the LED. An active cooling circuit receives temperature input from the temperature sensor. The temperature input is indicative of the temperature of the LED. An active cooling system cools the LED. The active cooling system being controlled by the active cooling circuit to control a temperature of the LED.

17 Claims, 4 Drawing Sheets

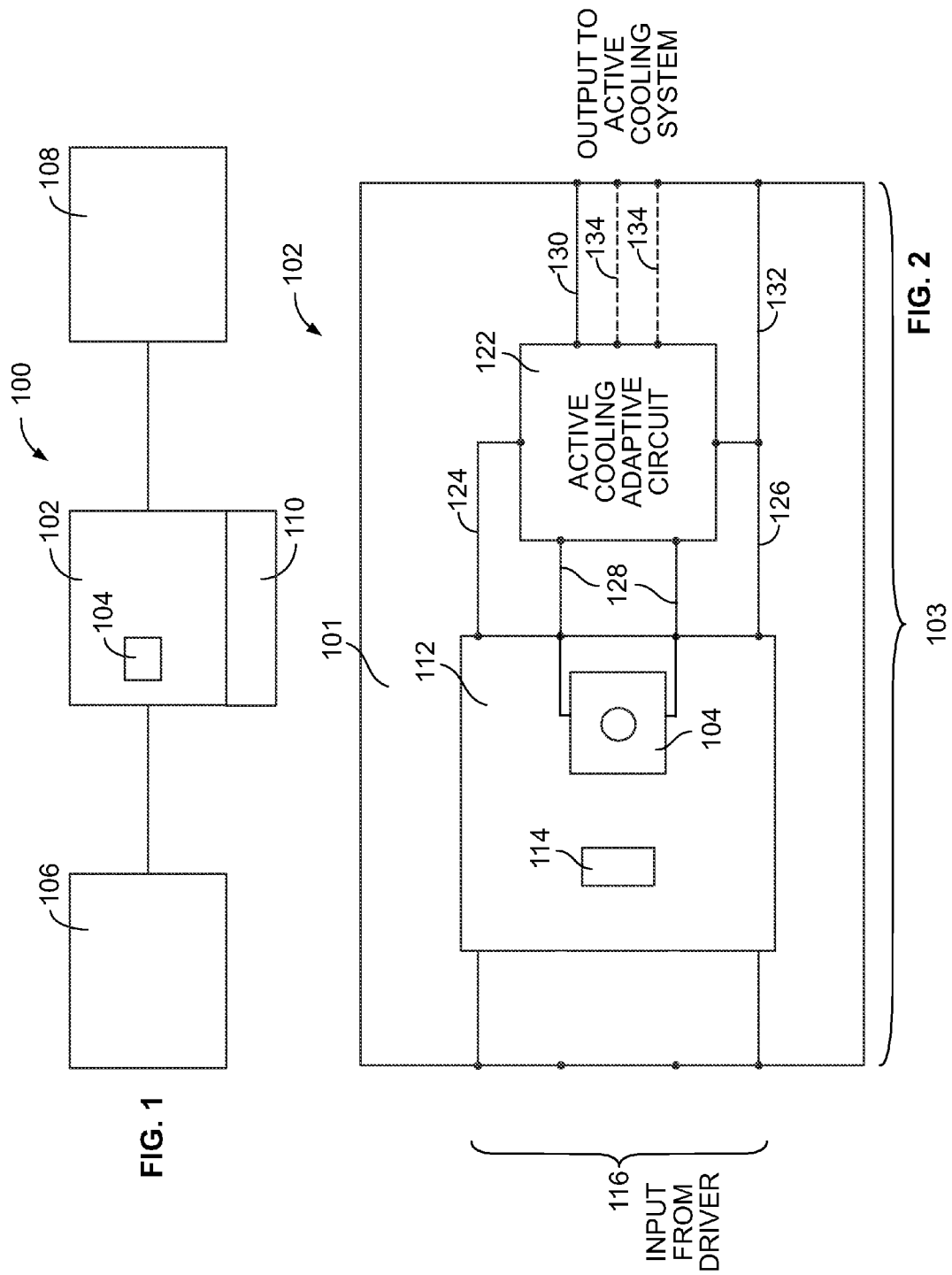

LIGHT EMITTING DIODE ASSEMBLY HAVING ACTIVE COOLING

BACKGROUND OF THE INVENTION

The subject matter described herein relates to a light emitting diode (LED) assembly.

Generally LED assemblies include a LED module having at least one LED. The LED may generate a substantial amount of heat that may affect a performance of the LED and/or the LED assembly as a whole. For example, excessive heat may cause the LED to output less lumens of light than the LED is intended to output. Alternatively, excessive heat in the LED may damage the LED, LED module, and/or the LED assembly. Typically, LED modules are coupled to a heat sink to control temperatures of the LED. The heat sink is configured to absorb heat from the LED to maintain a performance of the LED assembly.

However, conventional LED assemblies are not without their disadvantages. For example, heat sinks are passive cooling devices. The heat sinks are typically designed to effectively cool the LED at the maximum operating temperature of the LED. Heat sinks may not always be effective in cooling the LED, especially when the LED is reaching substantially high temperatures. As such, heat sinks are overdesigned for normal operation of the LED. The heat sinks are larger than needed for most operating temperatures, leading to a bulky LED assembly. The bulky heat sinks increase the space required to install the LED assembly. When smaller heat sinks are used, such other LED assemblies use active cooling systems, such as fans or other similar devices, to cool the LEDs. Such systems operate independent of the LED assembly, require their own power source, and are not temperature dependent.

A need remains for an LED assembly having active cooling. Another need remains for an LED assembly having a cooling system that does not require secondary power. Another need remains for an LED assembly that reduces the size of the components required to cool the LED.

SUMMARY OF THE INVENTION

In one embodiment, a light emitting diode (LED) assembly is provided having a LED and a temperature sensor for monitoring a temperature of the LED. An active cooling circuit receives temperature input from the temperature sensor. The temperature input is indicative of the temperature of the LED. An active cooling system cools the LED. The active cooling system being controlled by the active cooling circuit to control a temperature of the LED.

In another embodiment, a light emitting diode (LED) assembly is provided having a driver and a LED powered by the driver. A temperature sensor monitors a temperature of the LED. An active cooling system cools the LED based on a temperature of the LED. The active cooling system being powered by the driver. A power conversion module takes off power from the driver to power the active cooling system.

In another embodiment, a light emitting diode (LED) assembly is provided having a driver and a LED powered by the driver. A temperature sensor monitors a temperature of the LED. An active cooling circuit receives temperature input from the temperature sensor. The temperature input being indicative of the temperature of the LED. A fan cools the LED. The fan being controlled by the active cooling circuit to control a temperature of the LED. The fan being powered by the driver.

BRIEF DESCRIPTION OF THE DRAWINGS

The presently disclosed subject matter will be better understood from reading the following description of non-limiting embodiments, with reference to the attached drawings, wherein below:

FIG. 1 is a block diagram of a light emitting diode (LED) assembly formed in accordance with an embodiment.

FIG. 2 is a circuit diagram of a LED module formed in accordance with an embodiment.

DETAILED DESCRIPTION OF THE INVENTION

Figure 3:
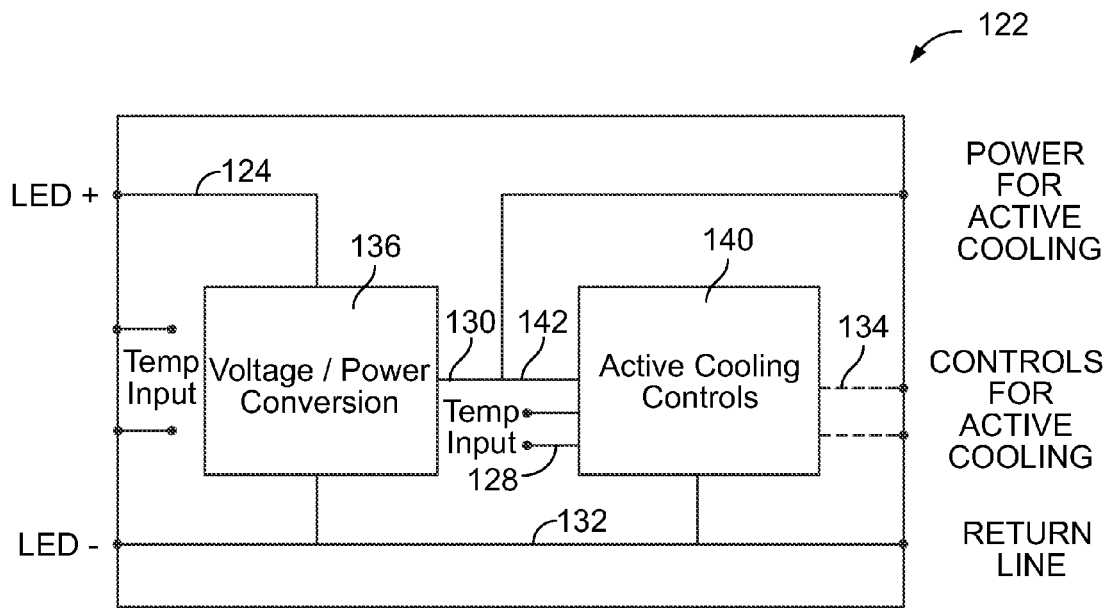
FIG. 3 is a circuit diagram of an active cooling circuit formed in accordance with an embodiment.

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments described herein include a light emitting diode (LED) assembly having active cooling. The LED assembly includes a LED module having a LED and a temperature sensor. The LED module also includes an active cooling circuit. The active cooling circuit receives a temperature input from the temperature sensor. The temperature input is indicative of a temperature of the LED. The active cooling circuit delivers control signals to an active cooling system to cool the LED. The active cooling system may be a fan or the like. The active cooling system is powered by the same power supply for the LED module. The active cooling system is controlled by the active cooling circuit by turning the active cooling system on or off in response to the temperature of the LED. In one embodiment, the active cooling system is adaptively controlled by the active cooling circuit. For example, the active cooling circuit may control an output of the active cooling system based on the temperature of the LED being within a predetermined temperature range. Alternatively, the active cooling circuit may continually adjust the output of the active cooling system based on the temperature of the LED.

The LED assembly also includes a driver to power the LED and the temperature sensor. In an exemplary embodiment, the driver also powers the active cooling circuit and the active cooling system. For example, a power converter may be provided to take off power from the driver to power the active cooling circuit and the active cooling system.

FIG. 1 is a block diagram of a LED assembly 100 formed in accordance with an embodiment. The LED assembly 100 includes a LED module 102 having at least one LED 104. The LED module 102 is electrically coupled to a driver 106. The driver 106 directs a power signal to the LED module 102 to power the LED module 102 and the LED 104. An active cooling system 108 is electrically coupled to the LED module 102. The active cooling system 108 may be a fan or the like. The active cooling system 108 is powered by the driver 106 via the LED module 102 or the LED assembly 100.

During operation, the LED 104 may generate heat that may affect the performance of the LED module 102. For example, excessive heat may reduce an amount of lumens produced by the LED 104. Excessive heat may also damage the LED 104, the LED module 102, and/or the LED assembly 100. The active cooling system 108 is configured to direct cool air to the LED module 102 to cool the LED 104 and the LED module 102. For example, the active cooling system 108 may be a fan that directs cool air to the LED module 102. In one embodiment, the LED module 102 may also include a heat sink 110 that is cooled by the air discharged from the active cooling system 108. Accordingly, the LED assembly 100 provided both passive cooling (through the heat sink 110) and active cooling (through the active cooling system 108) of the LED module 102.

In an exemplary embodiment, the active cooling system 108 is controlled based on a temperature of the LED 104. An output (e.g. an amount of airflow) of the active cooling system 108 is controlled based on changes in the temperature of the LED 104. For example, the active cooling system 108 may be turned on or off based on the temperature of the LED 104. Optionally, an output of the active cooling system 108 may be adaptively controlled based on the temperature of the LED 104 being within a predetermined interval. The active cooling system 108 may also be continuously controlled based on the temperature of the LED 104.

FIG. 2 is a circuit diagram of the LED module 102. The LED module 102 includes a printed circuit board 101. The LED module 102 includes a LED and temperature sensing component 112 mounted to the printed circuit board 101. The LED and temperature sensing component 112 may be a chip mounted to the printed circuit board 101. The LED and temperature sensing component 112 includes the at least one LED 104 and a temperature sensing device 114. Optionally, the LED 104 and the temperature sensing device 114 may be separately mounted to the printed circuit board 101 rather than being part of a single component. The temperature sensing device 114 monitors a temperature of the LED 104. The temperature sensing device 114 may be an active or passive temperature sensor. The temperature sensing device 114 may be an analog or digital sensor. The printed circuit board 101 includes a power circuit 103 to power the LED and temperature sensing component 112. The driver 106 (shown in FIG. 1) is electrically coupled to the power circuit 103 through power inputs 116 that power the at least one LED 104 and the temperature sensing device 114.

The LED and temperature sensing component 112 is electrically coupled to an active cooling circuit 122. The active cooling circuit 122 is powered via a power lead 124 and a power return 126. The active cooling circuit 122 is powered by the driver 106 through the LED and temperature sensing component 112. The power lead 124 extends to the active cooling circuit 122 to provide power thereto. The power return 126 extends from the active cooling circuit 122 back to the LED and temperature sensing component 112. Optionally, the active cooling circuit 122 may be directly powered by the driver 106.

A pair of signal traces 128 extends from the LED and temperature sensing component 112 to the active cooling circuit 122. The signal traces 128 extend from the temperature sensing device 114 to the active cooling circuit 122. The signal traces 128 may be part of the active cooling circuit 122 or the temperature sensing device 114. The temperature sensing device 114 sends a temperature input to the active cooling circuit 122 through the signal traces 128. The temperature input is indicative of a temperature of the LED 104. The active cooling circuit 122 controls the active cooling system 108 (shown in FIG. 1) based on the temperature input. The active cooling circuit 122 controls a power output to the active cooling system 108 based on the temperature input. For example, the active cooling circuit 122 may turn the active cooling system 108 on or off based on the temperature input. Additionally, the active cooling circuit 122 may control a speed of the active cooling system 108 based on the temperature input, such as by controlling an amount of power supplied to the active cooling system 108.

The power circuit 103 includes a power output 130 that electrically couples the power circuit 103 to the active cooling system 108. The active cooling system 108 is powered by the active cooling circuit 122 through the power output 130. In particular, the active cooling system 108 is powered by the driver 106 via power signals transmitted through the active cooling circuit 122. In an alternative embodiment, the active cooling system 108 may be powered directly by the driver 106. A power return 132 returns a power signal from the active cooling system 108 to the active cooling circuit 122 and the LED and temperature sensing component 112. In one embodiment, the power return 132 may transmit a power signal directly to the driver 106.

In one embodiment, the active cooling circuit 122 may include at least one control trace 134. The control traces 134 send control signals from the active cooling circuit 122 to the active cooling system 108. The control trace 134 may send analog or digital control signals from the active cooling circuit 122 to the active cooling system 108. The control signals may be utilized to control an output of the active cooling system 108. For example, in an embodiment wherein the active cooling circuit 122 controls a speed of the active cooling system 108, one or more control traces 134 may extend between the active cooling circuit 122 and the active cooling system 108. The number of control traces 134 may depend on a number of inputs provided at the active cooling system 108. Alternatively, the active cooling circuit 122 may only control the active cooling system 108 by turning the active cooling system 108 on and off. In such an embodiment, the LED module 102 may not include any control traces 134 between the active cooling circuit 122 and the active cooling system 108.

FIG. 3 is a circuit diagram of the active cooling circuit 122. The active cooling circuit 122 may include a power conversion module 136 to take off power from the driver 106 (shown in FIG. 1). The power conversion module 136 may convert a voltage of the power signal from the driver 106. For example, the LED module 102 may be configured to operate at approximately thirty volts. Accordingly, the driver 106 is configured to output a power signal of approximately thirty volts. However, the active cooling circuit 122 (shown in FIG. 2) and/or the active cooling system 108 (shown in FIG. 1) may be configured to operate at approximately twelve volts. The power conversion module 136 receives a thirty volt power signal from the driver 106 through the power lead 124. The power conversion module 136 converts the voltage of the power signal from thirty volts to twelve volts to accommodate powering the active cooling circuit 122 and the active cooling system 108.

The power output 130 electrically couples the power conversion module 136 to the active cooling system 108. Accordingly, the power conversion module 136 converts the voltage of the power signal from the driver 106 to power the active cooling system 108. The power return 132 returns the power signal from the active cooling system 108 to the driver 106.

The power return 132 may return the power signal to driver 106. The power return 132 may return the power signal directly to the driver 106. Alternatively, the power return 132 may return the power signal to the power conversion module 136, where the power signal is converted back to approximately thirty volts. The power return 132 then returns the power signal from the power conversion module 136 to the driver 106.

The active cooling circuit 122 includes active cooling controls 140. A branch 142 of the power output 130 directs the converted power signal from the power conversion module 136 to the active cooling controls 140. Accordingly, the power conversion module 136 converts the voltage of the power signal from the driver 106 to power the active cooling controls 140. The power return 132 returns the power signal from the active cooling controls 140 to the driver 106. The power return 132 may return the power signal directly to the driver 106. Alternatively, the power return 132 may return the power signal to the power conversion module 136. The power return 132 then returns the power signal from the power conversion module 136 to the driver 106.

The signal traces 128 are electrically coupled to the active cooling controls 140. The signal traces 128 direct the temperature input from the temperature sensing device 114 to the active cooling controls 140. The active cooling controls 140 include circuitry (not shown) that controls the active cooling system 108 based on an algorithm, for example, the algorithms shown in FIGS. 4-6. The active cooling controls 140 may control the active cooling system 108 by sending commands through the control traces 134.

Figure 4:
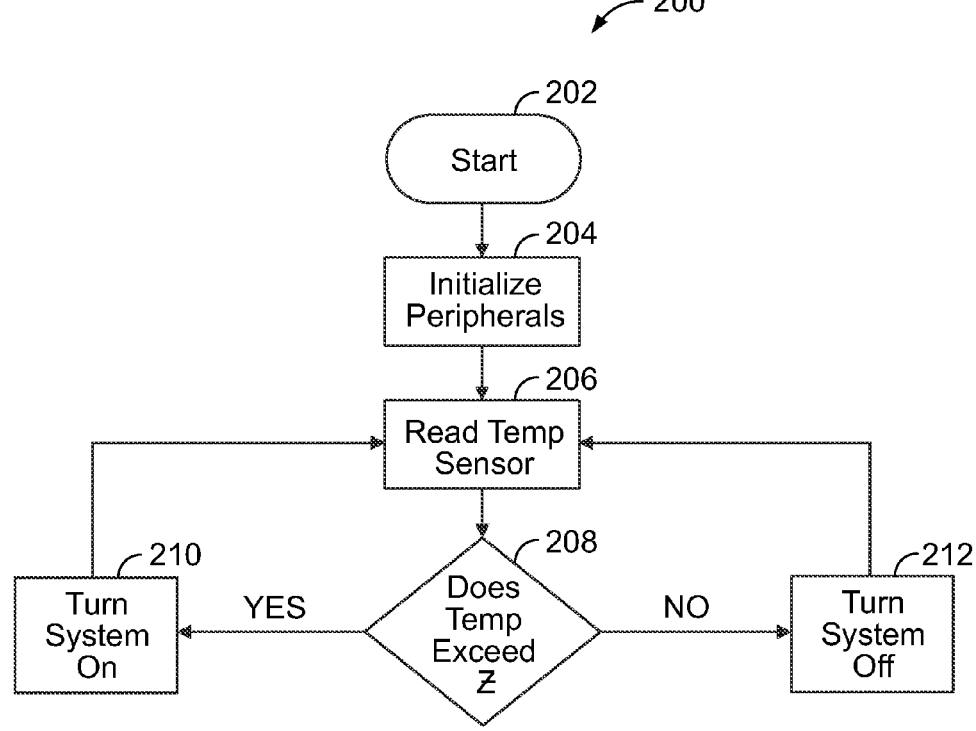
FIG. 4 is a flowchart of a method of operating a LED assembly in accordance with an embodiment.

FIG. 4 is a flowchart of an algorithm 200 for operating the LED assembly 100 in accordance with an embodiment. The algorithm 200 is a method of providing fixed control over the active cooling system 108 (shown in FIG. 1). At 202, the LED assembly 100 is started. Starting the LED assembly 100 may consist of activating a switch, for example, a light switch. Starting the LED assembly 100 activates the driver 106 (shown in FIG. 1) to begin supplying power to the LED assembly 100, thereby activating the LED 104 (shown in FIG. 1). At 204, peripherals are initialized. For example, the active cooling system 108 may be warmed-up or otherwise placed in a standby operation. Additionally, the temperature sensing device 114 (shown in FIG. 2) may be activated or calibrated. The temperature sensing device 114 may actively monitor the temperature of the LED 104 through a digital device. Alternatively, the temperature sensing device 114 may passively monitor the temperature of the LED 104 through a passive device.

At 206, the active cooling circuit 122 (shown in FIG. 2) reads the temperature input from the temperature sensing device 114. In particular, the active cooling circuit 122 receives the temperature input from the temperature sensing device 114. In an exemplary embodiment, the active cooling circuit 122 controls the active cooling system 108 based on a fixed temperature Z. The fixed temperature Z is predetermined based on cooling requirements of the LED 104. For example, any temperature over the temperature Z requires that the LED 104 be cooled. Alternatively, any temperature below the temperature Z does not require that the LED 104 be cooled.

At 208, the active cooling circuit 122 determines whether the temperature of the LED 104 exceeds the temperature Z. If the temperature of the LED 104 exceeds Z, the active cooling circuit 122 activates the active cooling system 108, at 210. If the active cooling system 108 is already activated, the active cooling system 108 continues to power the active cooling system 108. The active cooling system 108 is configured to produce a fixed output. For example, a fan of the active cooling system 108 may be configured to operate at a fixed speed. The fixed output and speed of the active cooling system 108 may be predetermined based on output requirements to cool the LED 104. After activating the active cooling system 108, the active cooling circuit 122 continues to read the temperature input from the temperature sensing device 114.

If the temperature of the LED 104 does not exceed the temperature Z, the active cooling circuit 122 deactivates the active cooling system 108, at 212. If the active cooling system 108 is already deactivated, the active cooling system 108 remains unpowered. After deactivating the active cooling system 108, the active cooling circuit 122 continues to read the temperature input from the temperature sensing device 114.

Figure 5:
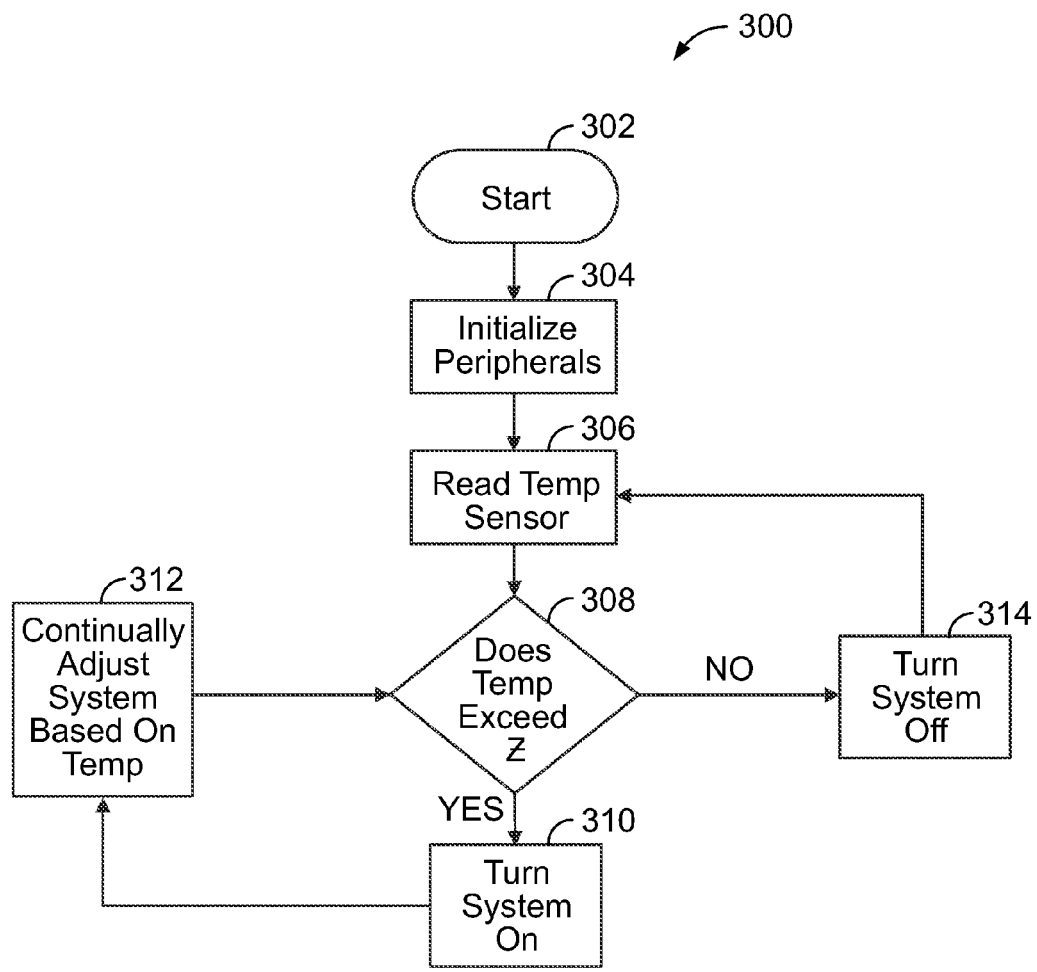
FIG. 5 is a flowchart of a method of operating a LED assembly in accordance with another embodiment.

FIG. 5 is a flowchart of an algorithm 300 for operating the LED assembly 100 in accordance with another embodiment. The algorithm 300 is a method of providing adaptive control over the active cooling system 108 (shown in FIG. 1). At 302, the LED assembly 100 is started. Starting the LED assembly 100 may consist of activating a switch, for example, a light switch. Starting the LED assembly 100 activates the driver 106 (shown in FIG. 1) to begin supplying power to the LED assembly 100, thereby activating the LED 104 (shown in FIG. 1). At 304, peripherals are initialized. For example, the active cooling system 108 may be warmed-up or otherwise placed in a standby operation. Additionally, the temperature sensing device 114 (shown in FIG. 2) may be activated. The temperature sensing device 114 may actively monitor the temperature of the LED 104 through a digital device. Alternatively, the temperature sensing device 114 may passively monitor the temperature of the LED 104 through a passive device.

At 306, the active cooling circuit 122 (shown in FIG. 2) reads the temperature input from the temperature sensing device 114. In particular, the active cooling circuit 122 receives the temperature input from the temperature sensing device 114. In an exemplary embodiment, the active cooling circuit 122 partially controls the active cooling system 108 based on a fixed temperature Z. The fixed temperature Z is predetermined based on cooling requirements of the LED 104. For example, any temperature over the temperature Z requires that the LED 104 be cooled. Alternatively, any temperature below the temperature Z does not require that the LED 104 be cooled.

At 308, the active cooling circuit 122 determines whether the temperature of the LED 104 exceeds the temperature Z. If the temperature of the LED 104 exceeds Z, the active cooling circuit 122 activates the active cooling system 108, at 310. If the active cooling system 108 is already activated, the active cooling system 108 continues to power the active cooling system 108. The active cooling system 108 is configured to produce a fixed output. For example, a fan of the active cooling system 108 may be configured to operate at a fixed speed. The fixed output and speed of the active cooling system 108 may be predetermined based on output requirements to cool the LED 104. After activating the active cooling system 108, the active cooling circuit 122 continues to read the temperature input from the temperature sensing device 114.

At 312, the active cooling circuit 122 continuously adjusts an output of the active cooling system 108. The active cooling circuit 122 adapts to any temperature over the predetermined temperature Z. As the temperature of the LED 104 increases to temperatures over the temperature Z, the active cooling circuit 122 controls the output of the active cooling system 108 commensurate with the temperature of the LED 104. For example, the active cooling circuit 122 responds to increases in the temperature of the LED 104 by a corresponding increase in active cooling system 108 output. Likewise, the active cooling circuit 122 responds to decreases in the temperature of the LED 104 by a corresponding decrease in active cooling system 108 output. If the temperature of the LED 104 decreases below the temperature Z, the active cooling circuit 122 shuts off the active cooling system 108.

If the temperature of the LED 104 does not exceed the temperature Z, the active cooling circuit 122 deactivates the active cooling system 108, at 314. If the active cooling system 108 is already deactivated, the active cooling system 108 remains unpowered. After deactivating the active cooling system 108, the active cooling circuit 122 continues to read the temperature input from the temperature sensing device 114.

Figure 6:
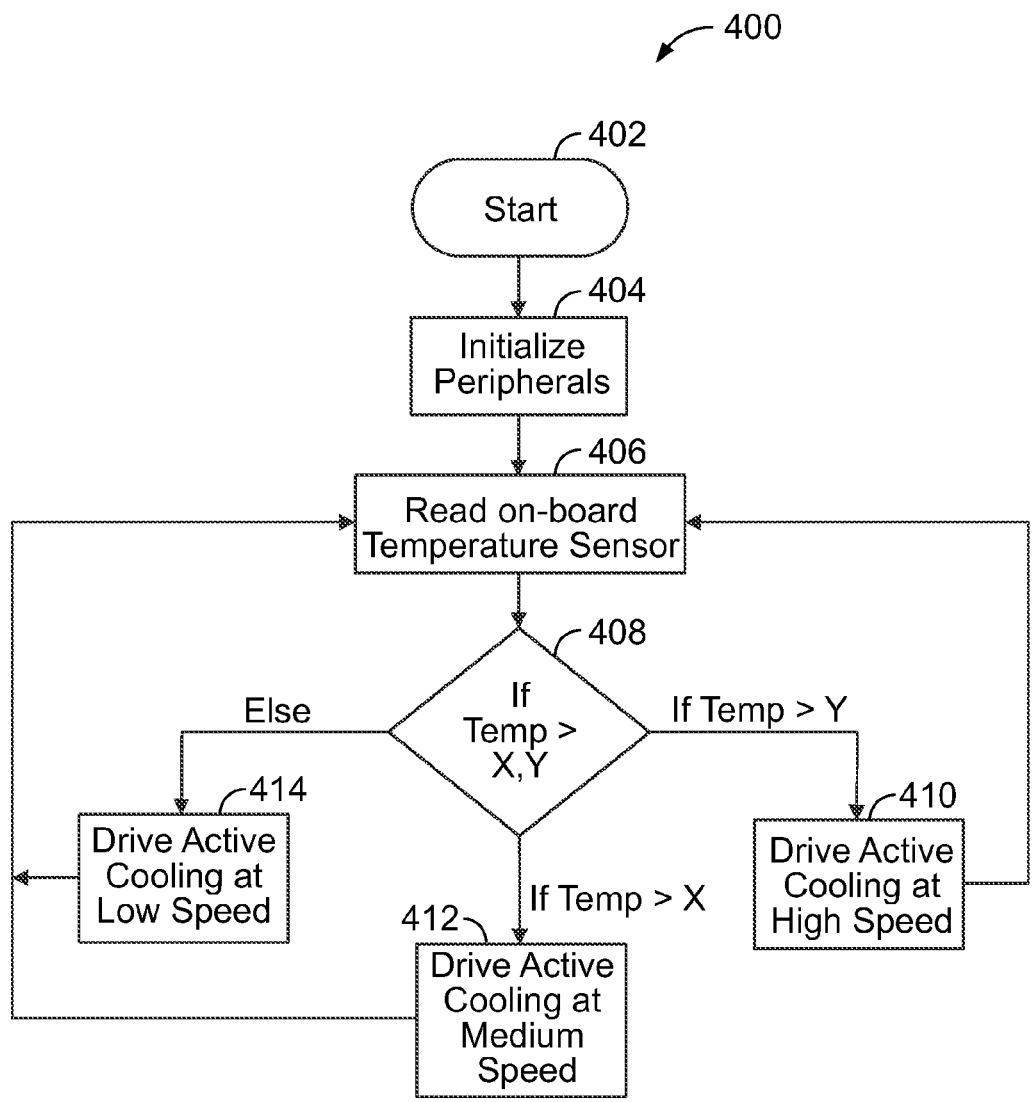
FIG. 6 is a flowchart of a method of operating a LED assembly in accordance with another embodiment.

FIG. 6 is a flowchart of an algorithm 400 for operating the LED assembly 100 in accordance with another embodiment. The algorithm 400 is a method of providing adaptive control over the active cooling system 108 (shown in FIG. 1). At 402, the LED assembly 100 is started. Starting the LED assembly 100 may consist of activating a switch, for example, a light switch. Starting the LED assembly 100 activates the driver 106 (shown in FIG. 1) to begin supplying power to the LED assembly 100, thereby activating the LED 104 (shown in FIG. 1). At 404, peripherals are initialized. For example, the active cooling system 108 may be warmed-up, calibrated or otherwise placed in a standby operation. Additionally, the temperature sensing device 114 (shown in FIG. 2) may be activated. The temperature sensing device 114 may actively monitor the temperature of the LED 104 through a digital device. Alternatively, the temperature sensing device 114 may passively monitor the temperature of the LED 104 through a passive device.

At 406, the active cooling circuit 122 (shown in FIG. 2) reads the temperature input from the temperature sensing device 114. In particular, the active cooling circuit 122 receives the temperature input from the temperature sensing device 114. In an exemplary embodiment, the active cooling circuit 122 controls the active cooling system 108 based on a predetermined temperature ranges. The predetermined temperature ranges are based on fixed temperatures X and Y. The active cooling circuit 122 may control the active cooling system 108 based on any number of temperature ranges in alternative embodiments. In an exemplary embodiment, the temperature Y is greater than the temperature X.

At 408, the active cooling circuit 122 determines whether the temperature of the LED 104 exceeds either of the temperatures X and Y. If the temperature of the LED 104 exceeds the temperature Y, the active cooling circuit 122 controls the active cooling system 108, at 410, at a high speed. The high speed of the active cooling system 108 is configured to provide a greater cooling output to the LED 104. After activating the active cooling system 108 at the high speed, the active cooling circuit 122 continues to receive temperature input from the temperature sensor 114, at 406.

If the temperature of the LED 104 exceeds the temperature X, but does not exceed the temperature Y, the active cooling circuit 122 controls the active cooling system 108, at 412, at a medium speed. The medium speed of the active cooling system 108 is configured to provide a cooling output to the LED 104 that is less than the cooling output of the high speed. After activating the active cooling system 108 at the medium speed, the active cooling circuit 122 continues to receive temperature input from the temperature sensor 114, at 406.

If the temperature of the LED 104 does not exceed both the temperature Y and the temperature X, the active cooling circuit 122 controls the active cooling system 108, at 414, at a low speed. The low speed of the active cooling system 108 is configured to provide a cooling output to the LED 104 that is less than the cooling output of the medium speed. In one embodiment, the active cooling circuit 122 may shut off the active cooling system 108, if the temperature of the LED 104 does not exceed both the temperature X and the temperature Y. After activating the active cooling system 108 at the low speed, the active cooling circuit 122 continues to receive temperature input from the temperature sensor 114, at 406.

The LED assembly 100 provides an active cooling system 108 that is controlled by a active cooling circuit 122 to turn the active cooling system 108 on or off in response to a temperature of the LED 104. In one embodiment, the active cooling system 108 is adaptively controlled by the active cooling circuit 122. For example, the active cooling circuit 122 may control an output of the active cooling system 108 based on the temperature of the LED being within a predetermined temperature range. In particular, the active cooling system 108 may be operated at various speeds based on the temperature of the LED 104 being within a predetermined temperature range. Alternatively, the active cooling circuit 122 may continually adjust the output of the active cooling system 108 based on the temperature of the LED 104. For example, the active cooling circuit 122 increases an output of the active cooling system 108 commensurate with an increase in the temperature of the LED 104. Likewise, the active cooling circuit 122 decreases an output of the active cooling system 108 commensurate with a decrease in the temperature of the LED 104. The active cooling system 108 eliminates the need for bulky and expensive passive heat sinks.

The LED assembly 100 also includes a driver 106 to power the LED 104. In an exemplary embodiment, the driver 106 also powers the active cooling circuit 122 and the active cooling system 108. For example, a power conversion module 136 may be provided to convert a voltage of a signal from the driver 106 to power the active cooling circuit 122 and the active cooling system 108.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A light emitting diode (LED) assembly comprising:
a LED;
a temperature sensor for monitoring a temperature of the LED;
an active cooling circuit for receiving temperature input from the temperature sensor, the temperature input indicative of the temperature of the LED;
an active cooling system for cooling the LED, the active cooling system controlled by the active cooling circuit to control the temperature of the LED; and
power circuit for powering the LED and the active cooling system, the power circuit powered by a driver, the power circuit including the active cooling circuit for powering the active cooling system and an LED circuit for powering the LED and the temperature sensor, wherein a power signal from the driver is directed to the LED circuit and at least some of the power signal is taken off the LED circuit to power the active cooling circuit and the active cooling system.

2. The LED assembly of claim 1, wherein the active cooling circuit controls the active cooling system to turn the active cooling system on or off based on the temperature of the LED.

3. The LED assembly of claim 1, wherein the active cooling system is a variable speed fan and the active cooling circuit varies the speed of the variable speed fan based on the temperature of the LED being within one of multiple predetermined temperature ranges.

4. The LED assembly of claim 3, wherein, when the temperature of the LED is within a first predetermined temperature range, the variable speed fan is at least one of turned off or controlled to operate at a low speed; when the temperature of the LED is within a second predetermined temperature range, the variable speed fan is controlled to operate at a medium speed; and when the temperature of the LED is within a third predetermined temperature range, the variable speed fan is controlled to operate at a high speed.

5. The LED assembly of claim 1, wherein the active cooling circuit continually adjusts an output of the active cooling system commensurate with the temperature of the LED such that a greater cooling output is provided to the LED as the temperature of the LED increases.

6. The LED assembly of claim 1, further comprising a printed circuit board, the LED being mounted to the printed circuit board, the power circuit being a circuit of the printed circuit board, the active cooling circuit being a circuit of the printed circuit board.

7. The LED assembly of claim 1, further comprising a printed circuit board, the power circuit being a circuit of the printed circuit board, the LED being mounted to the printed circuit board and being supplied power from the power circuit, the active cooling system being electrically connected to the power circuit and being supplied power from the power circuit.

8. A light emitting diode (LED) assembly comprising:
a LED;
a temperature sensor for monitoring a temperature of the LED;
an active cooling circuit for receiving temperature input from the temperature sensor, the temperature input indicative of the temperature of the LED;
an active cooling system for cooling the LED, the active cooling system controlled by the active cooling circuit to control the temperature of the LED;
a power circuit for powering the LED and the active cooling system, the power circuit powered by a driver, the power circuit including the active cooling circuit for powering the active cooling system and an LED circuit for powering the LED and the temperature sensor, wherein a power signal from the driver is directed to the LED circuit and at least some of the power signal is taken off the LED circuit to power the active cooling circuit and the active cooling system; and
a power conversion module configured to take off the at least some of the power signal from the LED circuit to supply power to the active cooling circuit, wherein the power conversion module converts the voltage of the power signal that is taken off of the LED circuit to accommodate powering the active cooling circuit.

9. The LED assembly of claim 8, wherein the power circuit is disposed on a printed circuit board that has a power input and a power output, the driver is electrically connected to the power input and the active cooling system is electrically connected to the power output.

10. The LED assembly of claim 8, wherein the active cooling system is turned on or off based on the temperature of the LED.

11. The LED assembly of claim 8, wherein the active cooling system is a variable speed fan and the active cooling circuit varies the speed of the variable speed fan based on the temperature of the LED being within one of multiple predetermined temperature ranges, wherein, when the temperature of the LED is within a first predetermined temperature range, the variable speed fan is at least one of turned off or controlled to operate at a low speed; when the temperature of the LED is within a second predetermined temperature range, the variable speed fan is controlled to operate at a medium speed; and when the temperature of the LED is within a third predetermined temperature range, the variable speed fan is controlled to operate at a high speed.

12. A light emitting diode (LED) assembly comprising:
a LED,
a temperature sensor for monitoring a temperature of the LED;
an active cooling circuit for receiving temperature input from the temperature sensor, the temperature input indicative of the temperature of the LED;
an active cooling system for cooling the LED, the active cooling system controlled by the active cooling circuit to control the temperature of the LED; and
a power circuit for powering the LED and the active cooling system,
wherein the active cooling system is a variable speed fan and the active cooling circuit varies the speed of the variable speed fan based on the temperature of the LED being within one of multiple predetermined temperature ranges,
wherein when the temperature of the LED is within a first predetermined temperature range, the variable speed fan is at least one of turned off or controlled to operate at a low speed; when the temperature of the LED is within a second predetermined temperature range, the variable speed fan is controlled to operate at a medium speed; and when the temperature of the LED is within a third predetermined temperature range, the variable speed fan is controlled to operate at a high speed.

13. The LED assembly of claim 12, wherein the active cooling circuit controls the variable speed fan to turn the variable speed fan on or off based on the temperature of the LED.

14. The LED assembly of claim 12, wherein the active cooling circuit continually adjusts the speed of the variable speed fan commensurate with the temperature of the LED.

15. The LED assembly of claim 12, wherein a power conversion module converts a voltage of a power signal from the power circuit in order to power at least one of the active cooling circuit or the variable speed fan.

16. The LED assembly of claim 12, further comprising a printed circuit board, the LED being mounted to the printed circuit board, the active cooling circuit being a circuit of the printed circuit board.

17. The LED assembly of claim 12, wherein the power circuit is disposed on a printed circuit board, the LED being mounted to the printed circuit board and being supplied power from the power circuit, the variable speed fan being electrically connected to the power circuit and being supplied power from the power circuit.

\* \* \* \* \*